(12) United States Patent
Sugi et al.

(10) Patent No.: US 8,999,121 B2
(45) Date of Patent: Apr. 7, 2015

(54) SPUTTERING APPARATUS

(75) Inventors: Kyosuke Sugi, Fuchu (JP); Tetsuya Endo, Komae (JP); Einstein Noel Abarra, Hachioji (JP)

(73) Assignee: Canon Anelva Corporation, Kawasaki-shi (JP)

( * ) Notice: Subject to any disclaimer, the term of this patent is extended or adjusted under 35 U.S.C. 154(b) by 944 days.

(21) Appl. No.: 13/116,492

(22) Filed: May 26, 2011

(65) Prior Publication Data

US 2011/0272278 A1 Nov. 10, 2011

Related U.S. Application Data

(63) Continuation of application No. PCT/JP2008/073515, filed on Dec. 25, 2008.

(51) Int. Cl.
| | |
|---|---|
| *C23C 14/34* | (2006.01) |
| *C23C 14/22* | (2006.01) |
| *C23C 14/50* | (2006.01) |
| *H01J 37/32* | (2006.01) |
| *H01J 37/34* | (2006.01) |

(52) U.S. Cl.
CPC ............ *C23C 14/225* (2013.01); *C23C 14/34* (2013.01); *C23C 14/345* (2013.01); *C23C 14/505* (2013.01); *H01J 37/32568* (2013.01); *H01J 37/34* (2013.01)

(58) Field of Classification Search
CPC .... C23C 14/225; C23C 14/34; C23C 14/345; C23C 14/505; H01J 37/32568; H01J 37/34
USPC .............. 204/298.11, 298.27, 298.28, 298.29
See application file for complete search history.

(56) References Cited

U.S. PATENT DOCUMENTS

| | | | |
|---|---|---|---|
| 5,810,933 A | * | 9/1998 | Mountsier et al. ............. 118/724 |
| 5,962,080 A | * | 10/1999 | Tan et al. ....................... 427/529 |
| 6,045,672 A | | 4/2000 | Kobayashi et al. ......... 204/298.2 |
| 6,216,632 B1 | | 4/2001 | Wickramanayaka |
| 6,224,718 B1 | * | 5/2001 | Meyer ....................... 204/192.12 |
| 6,818,961 B1 | | 11/2004 | Rizzo et al. .................... 257/422 |

(Continued)

FOREIGN PATENT DOCUMENTS

| | | | |
|---|---|---|---|
| EP | 1928019 A2 | * | 6/2008 |
| JP | 03-202466 | * | 9/1991 |

(Continued)

OTHER PUBLICATIONS

Written Opinion of the International Searching Authority issued in International Application No. PCT/JP2008/073515—3 pages.

(Continued)

*Primary Examiner* — Rodney McDonald

(74) *Attorney, Agent, or Firm* — Fitzpatrick, Cella, Herper & Scinto

(57) ABSTRACT

The present invention provides a sputtering apparatus and a film-forming method capable of forming a magnetic film having a reduced variation in the orientation of the magnetic anisotropy. The sputtering apparatus of the present invention is equipped with a rotatable cathode and a rotatable stage. The stage can have an electrostatic chuck. Moreover, the stage may electrically be connected with a bias power source capable of applying a bias voltage to the stage. Furthermore, the stage may have the electrostatic chuck and electrically be connected with the bias power source.

13 Claims, 13 Drawing Sheets

(56) References Cited

U.S. PATENT DOCUMENTS

| | | |
|---|---|---|
| 7,785,449 B2 | 8/2010 | Endo et al. |
| 7,955,480 B2 | 6/2011 | Endo et al. |
| 2005/0109616 A1 | 5/2005 | Ohta et al. .............. 204/298.18 |
| 2010/0133090 A1 | 6/2010 | Endo et al. |
| 2011/0180401 A1 | 7/2011 | Endo et al. |

FOREIGN PATENT DOCUMENTS

| | | |
|---|---|---|
| JP | 05-010464 U | 2/1993 |
| JP | 6-144990 A | 5/1994 |
| JP | 8-296042 A | 11/1996 |
| JP | 9-310174 A | 12/1997 |
| JP | 11-283926 A | 10/1999 |
| JP | 2005-133110 A | 5/2005 |
| JP | 2005-213585 A | 8/2005 |
| JP | 2008-7806 A | 1/2008 |
| JP | 2008-179850 A | 8/2008 |

OTHER PUBLICATIONS

International Preliminary Report on Patentability issued in International Application No. PCT/JP2008/073515—16 pages.

\* cited by examiner

A-A

B-B

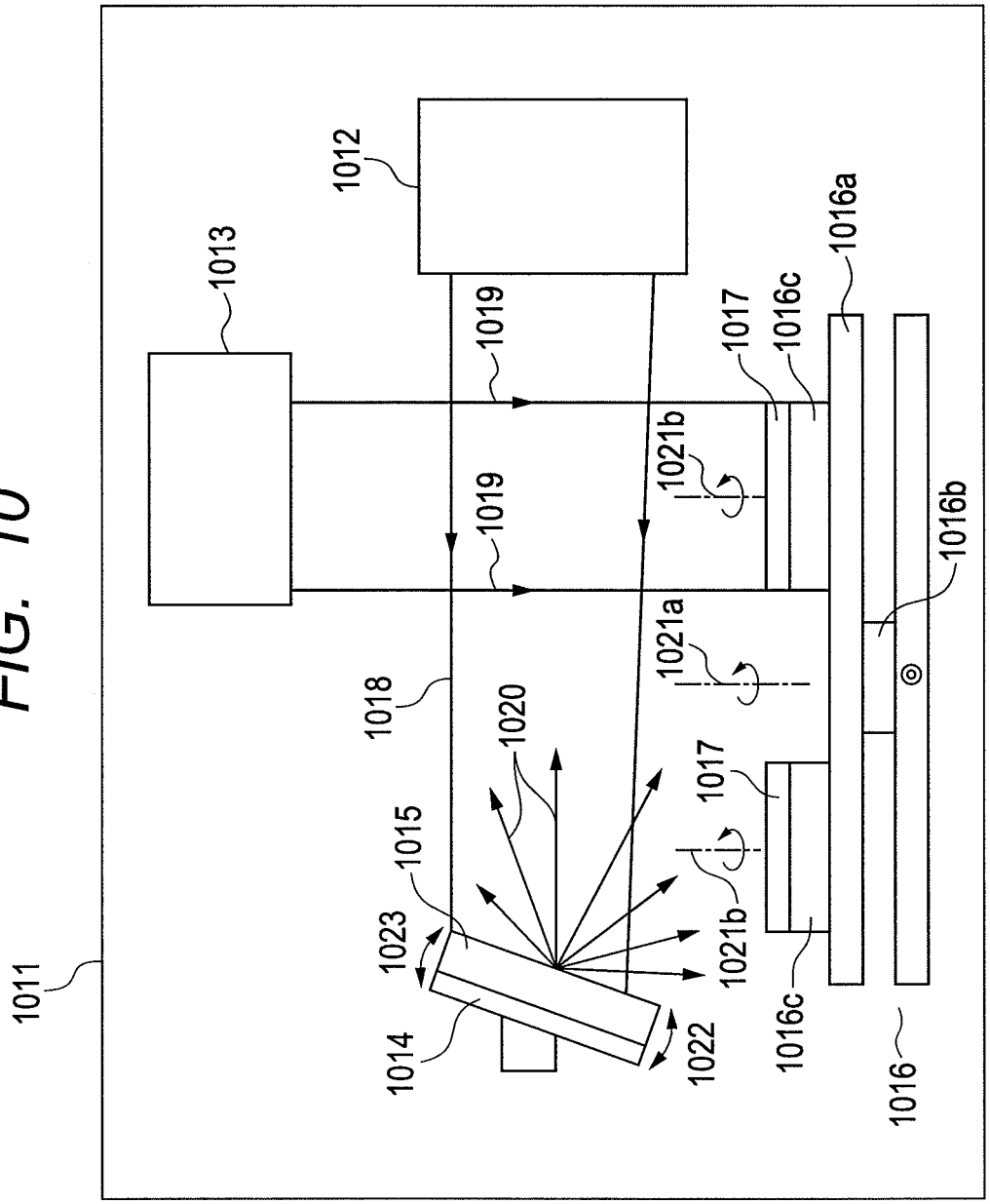

SPUTTERING APPARATUS

CROSS-REFERENCES TO RELATED APPLICATIONS

This application is a continuation application of International Application No. PCT/JP2008/073515, filed Dec. 25, 2008, the entire contents of which are incorporated herein by reference.

TECHNICAL FIELD

The present invention relates to a sputtering apparatus.

BACKGROUND ART

Recently, radio frequency (high frequency) applications of magnetic elements have expanded in read/write heads, micro inductors, micro transformers, and the like. Accordingly, thin magnetic films having excellent high-frequency properties are required also in a GHz band, and thus, research and development relative to these have been actively carried out. In order to use a thin magnetic film in a radio frequency band, it is necessary to increase the electric resistance of the thin film to thereby reduce eddy-current loss and to heighten resonant frequency. As a method for heightening the resonant frequency, there are such methods as heightening an anisotropic magnetic field Hk or a saturation magnetization Ms, but to heighten the Hk and Ms at the same time is generally difficult, and is in a trade-off relation. However, in recent years, it has become possible to enhance a uniaxial magnetic anisotropy due to the shape effect of crystals by causing sputtered particles to enter and orient obliquely relative to a substrate by using a sputtering method or an ion beam method, and to heighten the Hk, too, while maintaining a high Ms.

The application range of the oblique deposition is expanding repeatedly, and as a production method of causing sputtered particles to enter obliquely relative to a substrate to thereby form an obliquely oriented film, there is a substrate-passing type deposition structure in which a substrate passes the front of a target carrying out a sputtering operation (Patent Document 1). Furthermore, there is also a method in which only a substrate holder is rotated and controlled to thereby cause a film to grow obliquely (Patent Document 2).

Moreover, there is a method utilizing the oblique deposition when forming an insulating thin film by plural ion beams (Patent Document 3). That is, Patent Document 3 discloses a method for depositing an insulating thin film on a magnetic head, the method being for forming evenly an insulating film on a large surface area. FIG. 10 is an outline view of a deposition apparatus disclosed in Patent Document 3. The deposition apparatus shown in FIG. 10 comprises a chamber 1011 for housing a first ion beam gun 1012, a second ion beam gun 1013, a target holder 1014, and a substrate support 1016.

The substrate support 1016 has a turn table 1016a rotatable about a shaft 1016b (about an axis 1021a), and a substrate-fitting table 1016c rotatable about an axis 1021b. On the substrate-supporting table 1016c, a substrate 1017, on which a target material is to be deposited, can be arranged. On the other hand, the target holder 1014 is configured so as to be swingable in an arrow direction 1022, and can be fitted with a target 1015.

The first ion beam gun 1012 is disposed so that an ion beam 1018 enters the target 1015, and the ion beam 1018 causes the target material to disperse from the target 1015 in random directions 1020. The second ion beam gun 1013 is disposed so that another ion beam 1019 enters the substrate 1017 in the deposition process.

The method disclosed in Patent Document 3 can attain an even film thickness on the substrate 1017 by rotating suitably the target holder 1014, the turn table 1016a and the substrate-fitting table 1016c in the above-described configuration.

[Patent Document 1] U.S. Pat. No. 6,818,961
[Patent Document 2] Japanese Patent Application Laid-Open Publication No. 06-144990
[Patent Document 3] Japanese Patent Application Laid-Open Publication No. 08-296042
[Patent Document 4] Japanese Patent Application Laid-Open Publication No. 11-283926

SUMMARY OF THE INVENTION

In order to enhance the uniaxial magnetic anisotropy by the shape effect of a crystal, the uniform orientation of flaky microcrystals perpendicular to an incident plane is necessary, and, in order to realize it, the incident angle θ of sputtered particles shown in FIGS. 1 and 2 must be made large. FIG. 1 shows such situation that sputtered particles 102 enter the substrate 101 with an inclination of the angle θ relative to the direction perpendicular to the substrate. FIG. 2 is a drawing schematically showing the cross-sectional view of a film structure 202 obliquely grown by causing sputtered particles 201 to enter obliquely at an incident angle θ. The film structure 202 is formed from flaky microcrystals perpendicular to the incident plane X of sputtered particles 201.

In order to realize such film having an enhanced orientation using a substrate-passing type structure exemplified in FIG. 3 described in Patent Document 1, the moving range of the substrate must be broadened. That is, when the incident angle θ of sputtered particles is to be made larger and larger in order to enhance the uniaxial magnetic anisotropy by the shape effect, as shown in FIG. 3, the moving range of a substrate 301 that is subjected to a sputtering treatment by a target 302 can not help broadening in the horizontal direction, which, consequently, makes the whole apparatus larger. More specifically, in the passing type film deposition structure shown in FIG. 3, the film properties can be improved by expanding the substrate operation range from a range P2 to P3 to a range P1 to P4 to thereby enlarge the incident angle θ of sputtered particles, but, on the other hand, the whole deposition apparatus is made larger.

In the present description, the "incident angle" denotes an angle formed between the normal line of the substrate being the deposition subject of sputtered particles, and the incident direction of entering sputtered particles. Accordingly, a "low incident angle" is an incident angle of a case where the inclination of the incident direction of sputtered particles from the substrate normal line is relatively small, and a "high incident angle" is an incident angle of a case where the inclination of the incident direction of sputtered particles from the substrate normal line is relatively large.

The method in Patent Document 2 does not consider the control of the film thickness distribution and the incident direction of sputtered particles when the substrate to be deposited is large.

In the Patent Document 3, for the purpose of forming an insulating thin film so as to have an even thickness, the deposition is carried out while rotating the turn table 1016a and the substrate-fitting table 1016c. Accordingly, sputtered particles having respective incident angles enter the substrate 1017 from all directions. Furthermore, they enter the substrate 1017 from all angles from a low incident angle to a high incident angle. Accordingly, the magnetic anisotropy formed in the substrate 1017 becomes isotropic to thereby make it difficult to align good the axis of easy magnetization. Originally, Patent Document 3 does not discuss at all the reduction of variation in the magnetic anisotropy.

Furthermore, in Patent Document 3, the second ion beam gun 13 is used for forming a thin film with a good density. That is, Patent Document 3 designs the improvement of the adhesiveness of the film by moderate bombardment (striking) of a supplementary beam irradiated from the second ion beam gun 13.

As described above, in Patent Document 3, the first ion beam gun and the second ion beam gun are necessary in order to form an even thin film while making the density of the film formed appropriate, thereby causing the complexity and cost increases of the apparatus.

The present invention has been achieved in consideration of such problems, and a purpose thereof is to provide a sputtering apparatus capable of forming a magnetic film having a reduced variation in the direction of magnetic anisotropy by a compact configuration, even when the incident angle θ of sputtered particles is a high incident angle.

Furthermore, another purpose is to provide a sputtering apparatus capable of carrying out dense deposition, with a simple configuration.

A first aspect of the present invention is a sputtering apparatus equipped with a cathode having a sputtering target-supporting surface, in which the sputtering target-supporting surface is rotatable about a first rotation axis, and a stage having a substrate-supporting surface, in which the substrate-supporting surface is rotatable about a second rotation axis arranged parallel to the first rotation axis, wherein the stage has an electrostatic adsorption mechanism.

A second aspect of the present invention is a sputtering apparatus equipped with a cathode having a sputtering target-supporting surface, in which the sputtering target-supporting surface is rotatable about a first rotation axis, and a stage having a substrate-supporting surface, in which the stage is rotatable about a second rotation axis arranged parallel to the first rotation axis, wherein the stage is electrically connected with a bias power source capable of applying a bias voltage to the stage.

A third aspect of the present invention is equipped with a cathode having a sputtering target-supporting surface, in which the sputtering target-supporting surface is rotatable about a first rotation axis, and a stage having a substrate-supporting surface, in which the substrate-supporting surface is rotatable about a second rotation axis arranged parallel to the first rotation axis, wherein the stage has an electrostatic adsorption mechanism and is electrically connected with a bias power source capable of applying a bias voltage to the stage.

A fourth aspect of the present invention is a sputtering apparatus equipped with a cathode having a sputtering target-supporting surface, in which the sputtering target-supporting surface is rotatable about a first rotation axis, a stage having a substrate-supporting surface, in which the substrate-supporting surface is rotatable about a second rotation axis arranged parallel to the first rotation axis, and a shielding plate that is arranged between the sputtering supporting surface and the substrate-supporting surface and is rotatable about the first rotation axis or the second rotation axis, wherein the stage has an electrostatic adsorption mechanism.

A fifth aspect of the present invention is equipped with a cathode having a sputtering target-supporting surface, in which the sputtering target-supporting surface is rotatable about a first rotation axis, a stage having a substrate-supporting surface, in which the substrate-supporting surface is rotatable about a second rotation axis arranged parallel to the first rotation axis, and a shielding plate that is arranged between the sputtering supporting surface and the substrate-supporting surface and is rotatable about the first rotation axis or the second rotation axis, wherein the stage is electrically connected with a bias power source capable of applying a bias voltage to the stage.

A sixth aspect of the present invention is equipped with a cathode having a sputtering target-supporting surface, in which the sputtering target-supporting surface is rotatable about a first rotation axis, a stage having a substrate-supporting surface, in which the substrate-supporting surface is rotatable about a second rotation axis arranged parallel to the first rotation axis, and a shielding plate that is arranged between the sputtering supporting surface and the substrate-supporting surface and is rotatable about the first rotation axis or the second rotation axis, wherein the stage has an electrostatic adsorption mechanism and is electrically connected with a bias power source capable of applying a bias voltage to the stage.

BRIEF DESCRIPTION OF THE DRAWINGS

FIG. 10 is a schematic configuration diagram of a conventional deposition apparatus.

DESCRIPTION OF EMBODIMENTS

Figure 1:
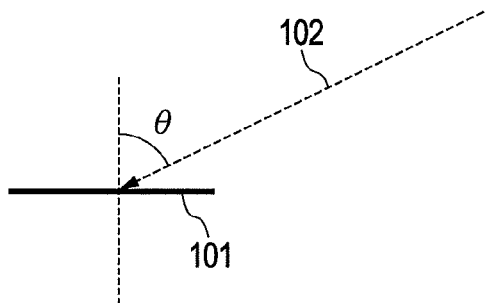
FIG. 1 is a drawing showing the situation of sputtered particles entering a substrate at a constant angle.
Figure 2:
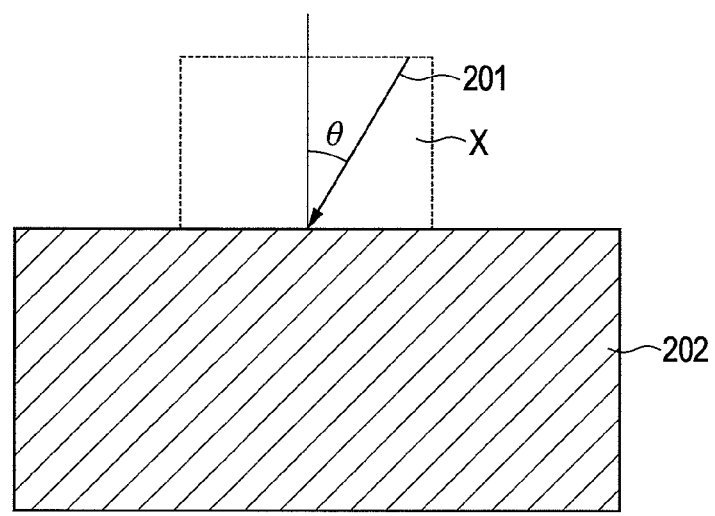
FIG. 2 is a drawing showing schematically a film structure grown obliquely by causing sputtered particles to enter obliquely at an incident angle θ.
Figure 3:
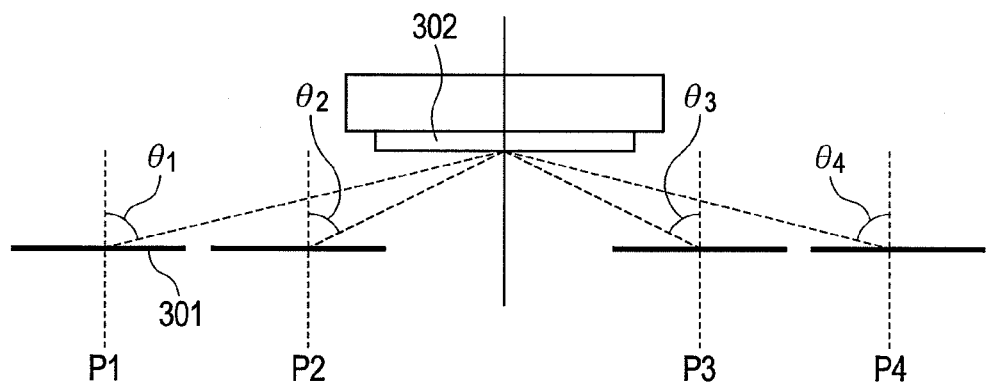
FIG. 3 is a drawing showing a passing type film deposition structure that is a conventional technology.

Hereinafter, embodiments of the present invention will be explained in detail with reference to the drawings. Meanwhile, in drawings explained below, those having the same function are given the same reference numeral, and the repeated explanation thereof is omitted.

Figure 4A:
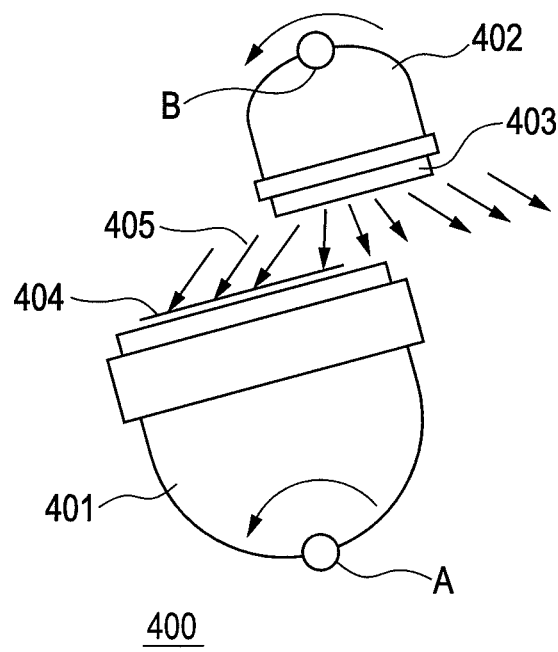
FIG. 4A is a side view of a sputtering apparatus according to an embodiment of the present invention.
Figure 4B:
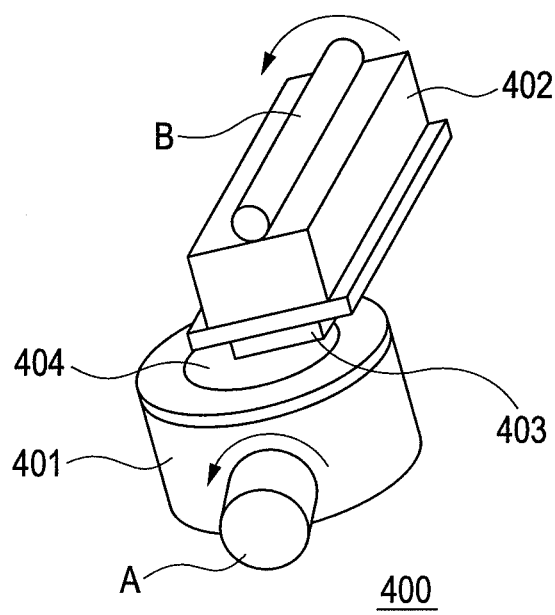
FIG. 4B is a perspective view of a sputtering apparatus according to an embodiment of the present invention.

FIG. 4A is a side view of a first sputtering apparatus 400 according to the present invention. FIG. 4B is a perspective view of the first sputtering apparatus 400 according to the present invention. The sputtering apparatus 400 comprises a stage 401 for placing a substrate 404, and a cathode 402 for supporting a target 403. The target-supporting surface of the cathode 402 and the substrate-supporting surface of the stage 401 are arranged so as to face each other. The stage 401 and the cathode 402 comprise a rotation axis A and a rotation axis B, respectively, and the stage 401 and the cathode 402 are configured so as to rotate about the rotation axis A and the rotation axis B, respectively, at an arbitrary angle. For example, the stage 401 and the cathode 402 may be rotated by using a rotation means such as a motor, and the rotation means may be controlled by a controlling apparatus.

The rotation axis A and the rotation axis B are arranged in parallel to each other, and the target 403 is supported by the cathode 402 so as to become parallel to the rotation axis B. The target 403 supported by the cathode 402 rotatable about the rotation axis B at an arbitrary angle can deposit sputtered particles 405 on the substrate 404 by bombarding ions in a plasma to the surface of the target 403 in both cases of motionless state and rotating state.

The substrate 404, to which deposition treatment is given by the target 403, is placed on the stage 401 rotatable about the rotation axis A at an arbitrary angle. Each of the substrate-supporting surface of the stage 401 and the target-supporting surface of the cathode 402 is configured so as to be rotatable independently about the rotation axis A and the rotation axis B, respectively.

In a sputtering apparatus according to an embodiment of the present invention, it is possible to cause sputtered particles to enter on the whole surface of the substrate 404 even in a narrow and limited space, by rotating independently the cathode 402 and/or the stage 401 at the same time along with the sputtering treatment. Moreover, as described above, the cathode 402 and the stage 401 are rotatable independently, and, therefore, the sputtering apparatus can be controlled so that sputtered particles enter the substrate 404 in a range of intended incident angles. For example, by setting the range of the intended incident range to be the range of high incident angles, the uniaxial magnetic anisotropy due to the shape effect can be given to the film to be formed.

Thus, according to the sputtering apparatus of the present invention, by rotating at least one of the cathode and the stage, it is possible to form a magnetic film having a good magnetic anisotropy by a compact configuration, even in the case where the incident angle relative to the substrate is made large.

Figure 5A:
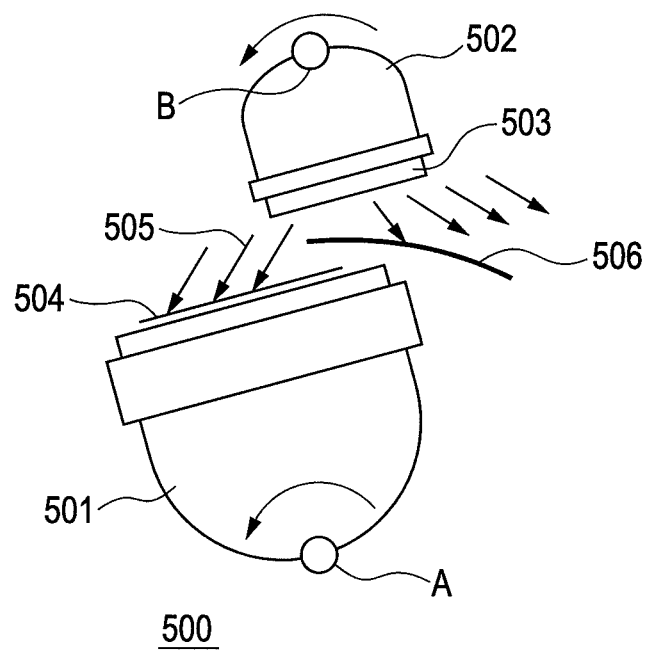
FIG. 5A is a side view of a sputtering apparatus according to an embodiment of the present invention.
Figure 5B:
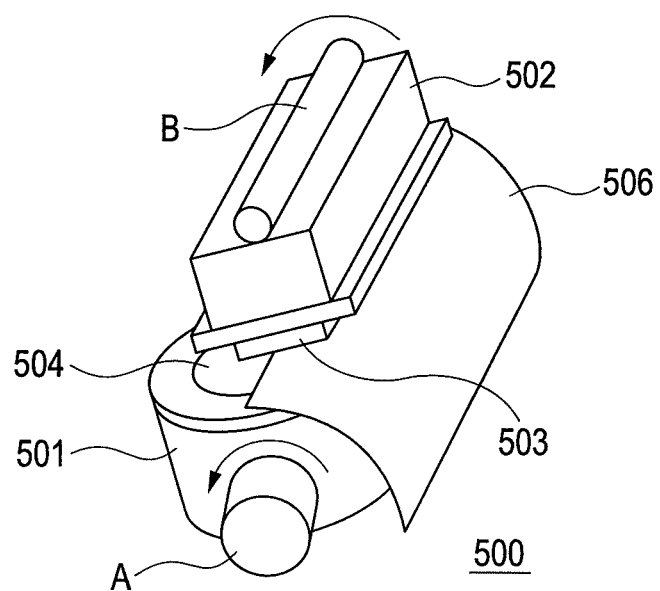
FIG. 5B is a perspective view of a sputtering apparatus according to an embodiment of the present invention.

FIG. 5A is a side view of a second sputtering apparatus 500 according to the present invention. FIG. 5B is a perspective view of the second sputtering apparatus 500 according to the present invention. In FIGS. 5A and B, the sputtering apparatus 500 comprises a stage 501 for placing a substrate 504, a cathode 502 for supporting a target 503, and a shielding plate 506. The target-supporting surface of the cathode 502 and the substrate-supporting surface of the stage 501 are arranged so as to face each other. The stage 501 and the cathode 502 comprise the rotation axis A and the rotation axis B, respectively, and the stage 501 and the cathode 502 are configured so as to rotate about the rotation axis A and the rotation axis B, respectively, at an arbitrary angle. For example, the stage 501 and the cathode 502 can be rotated by using such rotation means as a motor, and the rotation means can be controlled by a controlling apparatus.

The rotation axis A and the rotation axis B are arranged in parallel to each other, and the target 503 is supported by the cathode 502 so as to become parallel to the rotation axis B. The target 503 supported by the cathode 502 rotatable about the rotation axis B at an arbitrary angle can deposit sputtered particles 505 on the substrate 504 by bombarding ions in a plasma to the surface of the target 503 in both cases of motionless state and rotating state. The substrate 504, to which deposition treatment is given by the target 503, is placed on the stage 501 rotatable about the rotation axis A at an arbitrary angle. Each of the substrate-supporting surface of the stage 501 and the target-supporting surface of the cathode 502 is configured so as to be rotatable independently about the rotation axis A and the rotation axis B, respectively.

Furthermore, the shielding plate 506 is disposed between the target 503 and the stage 501. The shielding plate 506 has a means for rotating about either the rotation axis A or the rotation axis B at an arbitrary angle, and performs the function of adjusting finely the thickness distribution of a film to be deposited and enhancing the selectivity of the incident angle of sputtered particles. The shielding plate 506 can be rotated by the rotation axis A or the rotation axis B by any method, and in the present example, is rotatable about the rotation axis A. The shielding plate 506 can be controlled by a controlling apparatus so as to perform a rotary motion independently from the cathode 503 or the stage 501. The point of difference from FIGS. 4A and B lies in that the shielding plate 506 is disposed between the target 503 and the stage 501.

As described above, in the second sputtering apparatus, the shielding plate 506, the cathode 502, and the stage 501 are rotatable independently, which is advantageous for adjusting finely the film thickness distribution and enhancing the selectivity of the incident angle of sputtered particles. Furthermore, the substrate placed on the stage for placing a substrate can rotate about two rotation axes to thereby make it possible to form an oriented film with a high evenness while narrowing more the operating range of the target and stage.

Incidentally, as the result of hard studies and experiments, the inventor of the present application have found that, even when the incident angle of sputtered particles to the substrate is a low angle, the magnetic anisotropy is given to the film to be formed. Accordingly, at least one of rotations of the shielding plate 506, the cathode 502 and the stage 501 may be controlled so that the incident angle of sputtered particles entering the substrate 504 is a low incident angle, while using the shielding plate 506 that functions as a filter of the incident angle of sputtered particles relative to the substrate.

Figure 5C:
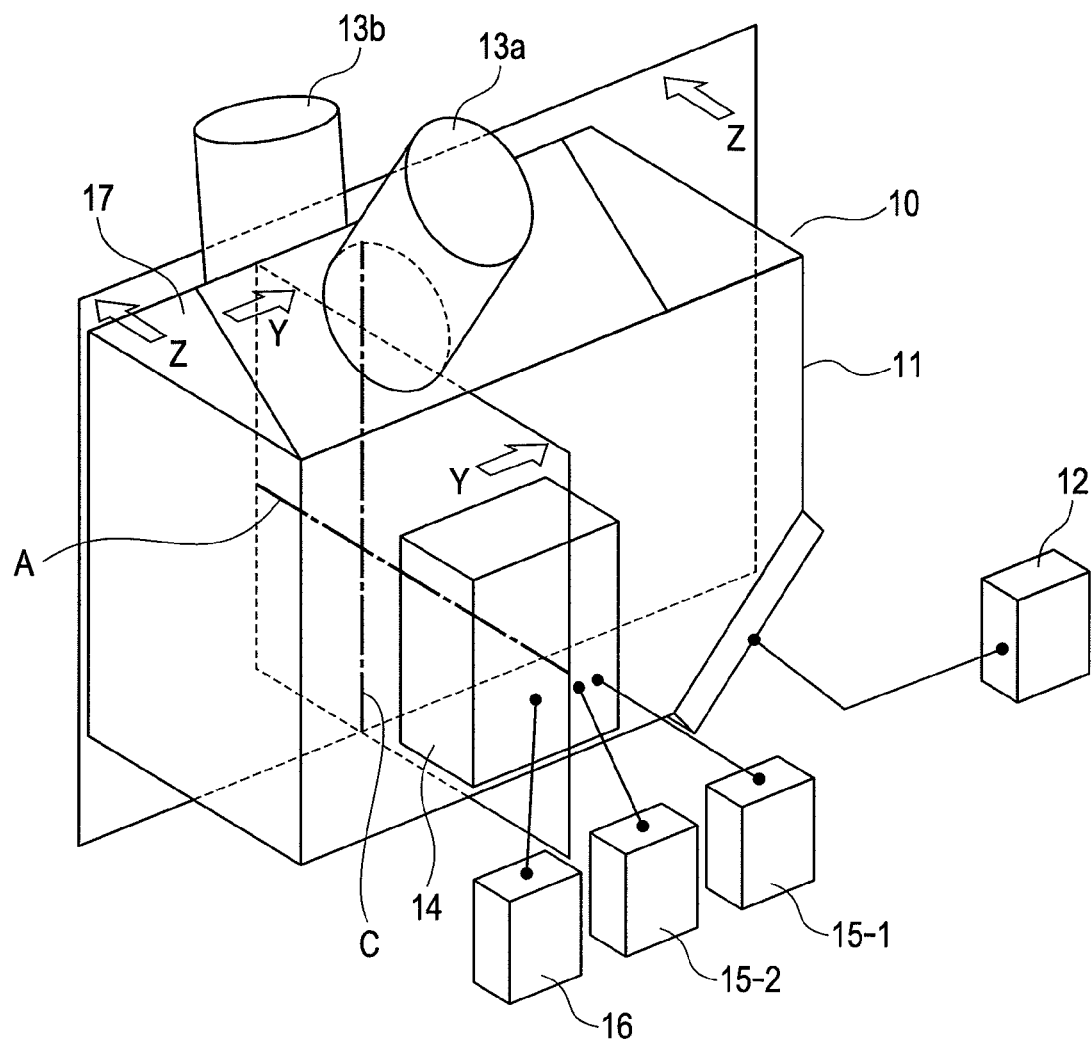
FIG. 5C is a perspective view showing the whole configuration of a sputtering apparatus according to an embodiment of the present invention.

FIG. 5C is a perspective view showing the whole configuration of the first and second sputtering apparatuses according to the present invention.

In FIG. 5C, a vacuum processing apparatus 10 comprises a vacuum chamber 11, the inside of which can be put into a state of a required reduced pressure by an exhaust unit 12. In the upper portion of the vacuum chamber 11, a roof-shaped cover 17 is disposed, and, to each of two slopes of the cover 17, PCM cathodes 13a and 13b equipped with a magnet are disposed, cathodes being capable of applying a point-cusp magnetic field inside the vacuum chamber 11. The specific structure of PCM cathodes 13a and 13b is described in detail in Patent Document 4 already published, and therefore, the explanation is omitted here. On the side surface of the vacuum chamber 11, a matching box 14 is disposed. With the matching box 14, two DC power sources 15-1 and 15-2 and an RF power source 16 are connected, to thereby make it possible to apply respective electric powers to a substrate (not shown) disposed inside the vacuum chamber 11 via the matching box 14.

Figure 5D:
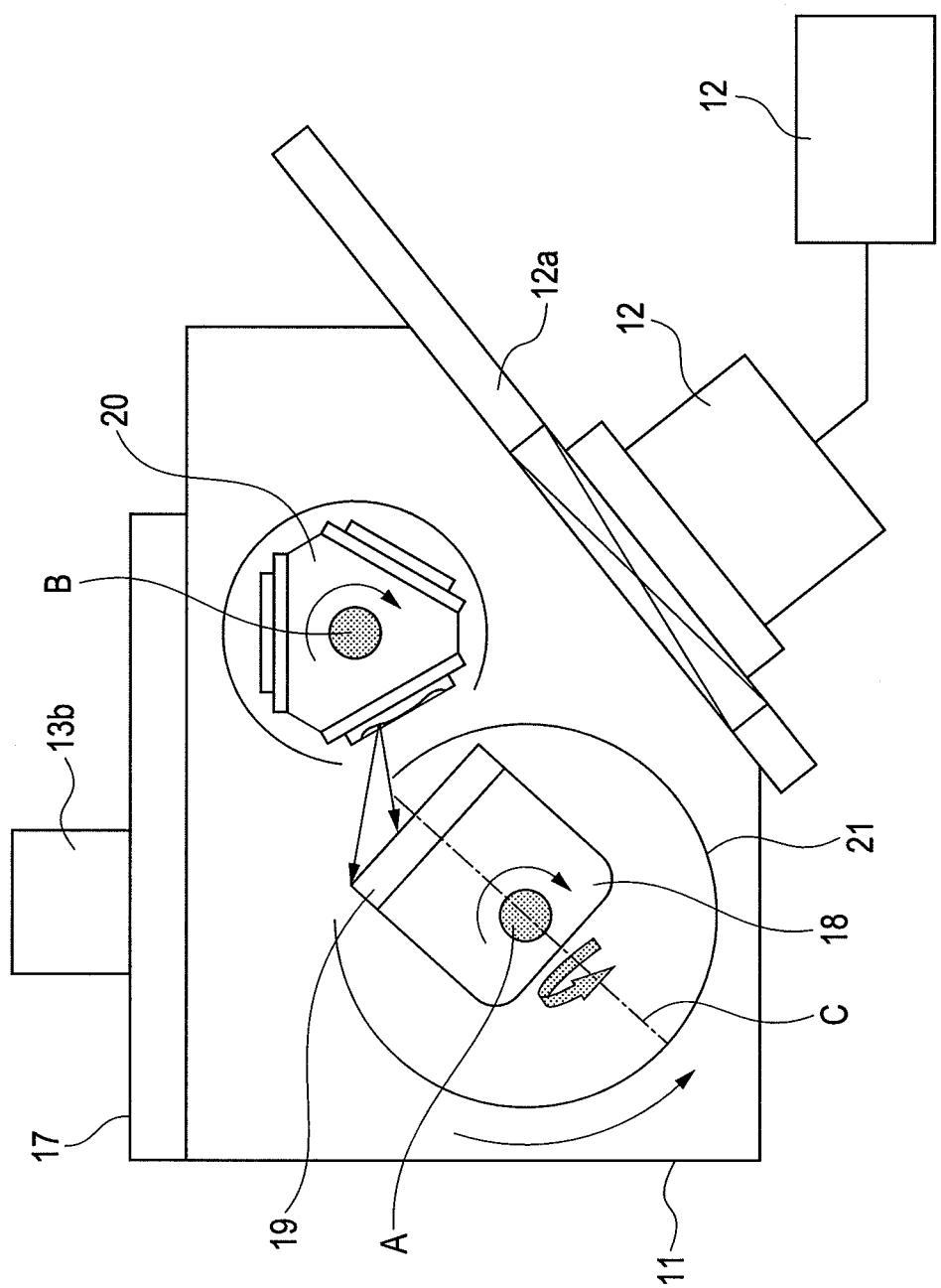
FIG. 5D is a Z-Z cross-sectional view in FIG. 5C.

FIG. 5D is a Z-Z cross-sectional view in FIG. 5C.

FIG. 5D shows that the stage and the cathode explained in the first sputtering apparatus and the second sputtering apparatus described above are arranged inside the vacuum chamber 11. Reference numeral 18 denotes a stage rotatable about the rotation axis A. Reference numeral 19 denotes a substrate-supporting/placing table that comprises an electrostatic adsorption mechanism and connected with the bias power source and is rotatable about a rotation axis C perpendicular to the rotation axis A. On the substrate-supporting/placing table 19, a substrate can be arranged. Reference numeral 20 denotes a cathode rotatable about the rotation axis B. On the target-supporting surface of the cathode 20, a target can be arranged. The substrate-supporting/placing table 19 and the cathode 20 are disposed face-to-face inside the vacuum chamber 11 that can be evacuated, and between these, a shielding plate 21 is disposed. In the lower portion of the vacuum vessel, the exhaust unit 12 is disposed, and the exhaust unit 12 has a valve 12a fitted in the fore stage.

Figure 5E:
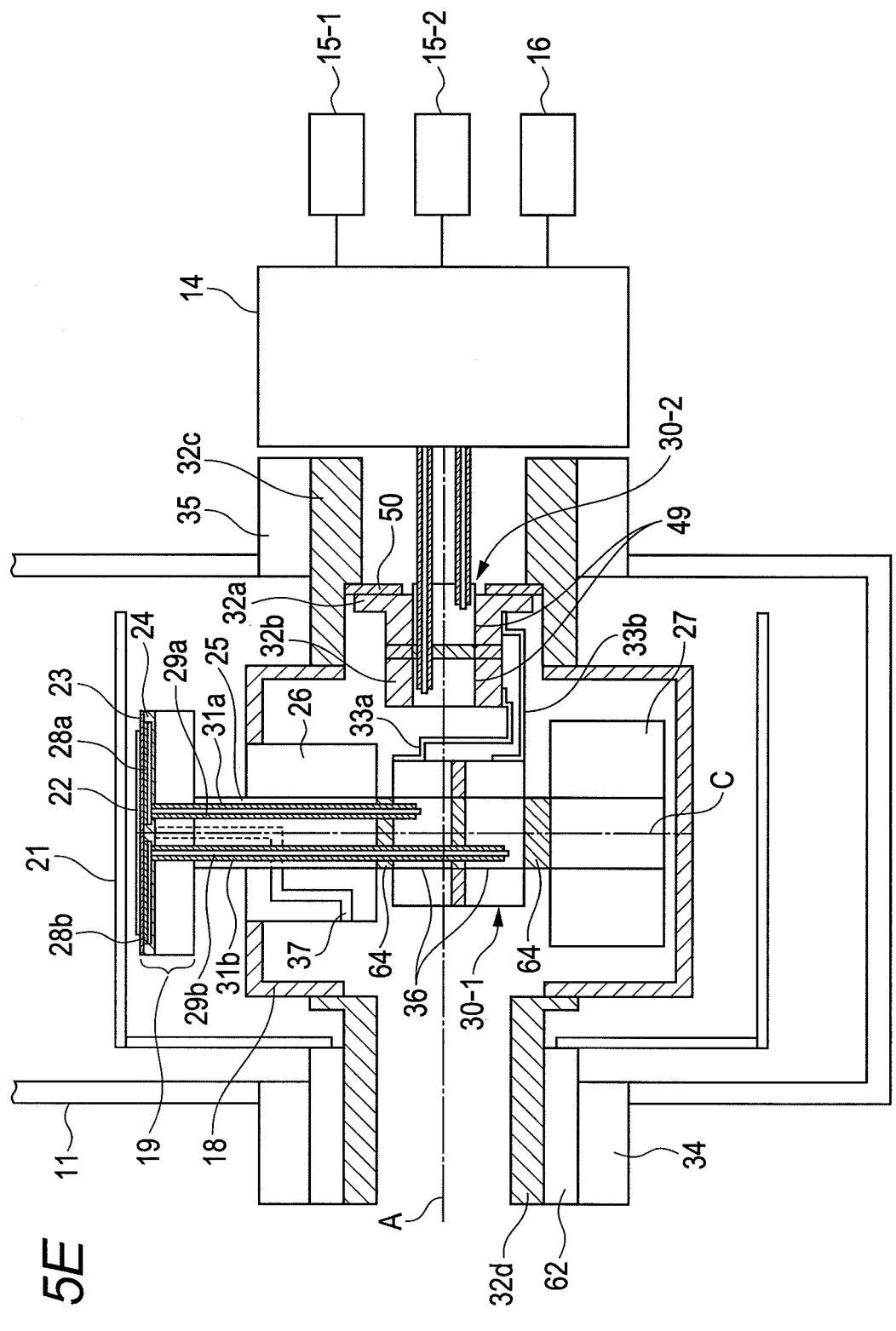
FIG. 5E is a Y-Y cross-sectional view in FIG. 5C.

FIG. 5E is a Y-Y cross-sectional view in FIG. 5C.

In FIG. 5E, the stage 18 is arranged in the vacuum chamber 11, and, in the upper portion of the stage 18, the substrate-supporting/placing table 19 is arranged. With the bottom surface of the substrate-supporting/placing table 19, a rotary pole 25 is connected. The rotary pole 25 made of an conductive material is fitted rotatably to a hole portion formed in the upper portion of the stage 18 via a vacuum seal mechanism 26 such as a magnetic fluid seal. This maintains the airtightness inside the vacuum chamber 11. The substrate-supporting/placing table 19 fixed to the rotary pole 25 is arranged so as to place rotatably the substrate 22 on the substrate-supporting/placing table 19 by a rotary mechanism (rotary driving mechanism 27 to be described later).

On the lower side of the vacuum seal mechanism 26, the rotary driving mechanism 27 is disposed. The rotary driving mechanism 27 functions as a motor for rotating the rotary pole 25 by the interaction of a magnet (not shown) arranged to the rotary pole 25 (not shown) and electromagnets (not shown) arranged around the periphery thereof. To the rotary driving mechanism 27, an encoder (not shown) for detecting the rotation number and the rotation direction of the rotary pole 25 is provided.

The substrate-supporting/placing table 19 comprises an dielectric plate 23 as a placing face for placing the substrate 22, and an electrostatic chuck (electrostatic adsorption apparatus) 24 for pressing and fixing the placed substrate 22 to the dielectric plate 23 with an appropriate electrostatic adsorption force. In addition, for the substrate-supporting/placing table 19, a fluid pathway 37 is formed for introducing a backside gas for heat conduction for the rear side of the substrate 22 fixed on the dielectric plate 23 by the electrostatic chuck 24. In the example, the fluid pathway 37 has a feed port disposed for the vacuum seal mechanism 26. The backside gas is a gas for transferring effectively the heat of the substrate-supporting/placing table 19 cooled by a cooling medium to the substrate 22, and conventionally, argon gas (Ar), nitrogen gas or the like is used.

The electrostatic chuck 24 is a chucking apparatus of a positive and negative bipolar type, and has two electrodes 28a and 28b inside thereof. The electrode 28a of one polarity and the electrode 28b of another polarity each is embedded in a plate-like insulating member. To the electrode 28a, a required first DC voltage is introduced via an electric power-introducing pole 29a disposed inside the substrate-supporting/placing table 19 and the rotary pole 25. To the electrode 28b, a required second DC voltage is introduced via an electric power-introducing pole 29b disposed inside the substrate-supporting/placing table 19 and the rotary pole 25. As shown in FIG. 5E, two electric power-introducing poles 29a and 29b are arranged in an expanded state to the lower side of the rotary pole 25, and are covered, respectively, by insulating members 31a and 31b.

When the RF bias voltage is to be applied, the RF bias voltage from the RF power source 16 is overlapped on the first and second DC voltages, which are applied to electrodes 28a and 28b. Thus, the bias voltage can be applied to the substrate 22.

In the middle of the rotary pole 25, there is provided an electric power-introducing mechanism 30-1 for giving two different kinds of bias voltages for electrostatic adsorption and the RF bias voltage to each of two electrodes 28a and 28b of the electrostatic chuck 24. Meanwhile, in order to avoid a state in which the electric power-introducing mechanism 30-1 is electrically connected with the vacuum seal mechanism 26 and the rotary driving mechanism 27 via the rotary pole 25, an insulating member 64 is inserted to the top and bottom of the portion of the rotary pole 25 passing through the electric power-introducing mechanism 30-1. The electric power-introducing mechanism 30-1 is connected with an electric power-introducing mechanism 30-2 by conductive members 33a and 33b. There are disposed a rotary joint portion 36 inside the electric power-introducing mechanism 30-1 and a rotary joint portion 49 inside the electric power-introducing mechanism 30-2, which are to be described later in detail.

Reference numerals 32a, 32b, 32c and 32d denote rotary cylinders that rotate about the rotation axis A, and the stage 18 is fixed to rotary cylinders 32a to 32d. Meanwhile, rotary cylinders 32a and 32b are parts of components of the electric power-introducing mechanism 30-2 to be described later, and, between the rotary cylinder 32a and the rotary cylinder 32c, an insulating member 50 is inserted. These rotary cylinders 32a to 32d are fitted rotatably to hole portions formed on right and left sides of the vacuum chamber 11 via vacuum seal mechanisms 34 and 35 such as a magnetic fluid seal. This maintains the airtightness inside the vacuum chamber 11. Meanwhile, in the embodiment, the vacuum seal mechanism 34 uses a bi-coaxial type and a rotary cylinder 62 is arranged coaxially outside the rotary cylinder 32d, wherein rotary cylinder 62 is connected with the shielding plate 21. Rotary cylinders 32d and 62 are rotated, for example, by a servomotor.

Figure 5F:
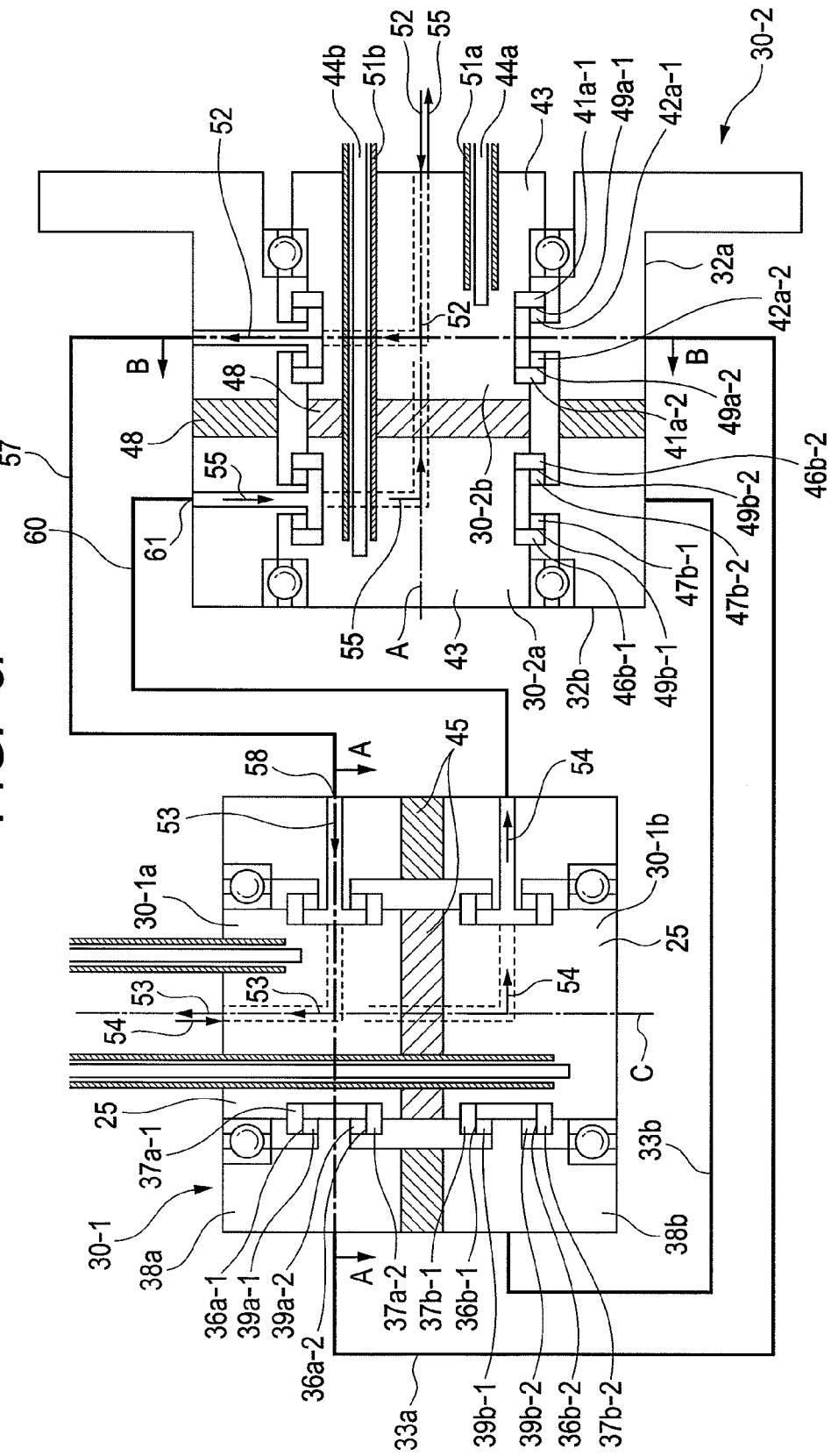
FIG. 5F is a drawing showing the details of electric power-introducing mechanisms 30-1 and 30-2 in FIG. 5E.

FIG. 5F is a drawing showing details of electric power-introducing mechanisms 30-1 and 30-2 in FIG. 5E.

FIG. 5F is a drawing showing details of electric power-introducing mechanisms 30-1 and 30-2, and details of rotary joint portions 36 and 49 will be explained on the basis of the drawing.

Rotary joint portions 36a-1 and 36a-2 comprise, for example, two conductive annular members 37a-1 and 37a-2 that are fixed to the rotary pole 25 and are arranged concentrically with the central axis C as the center, and for example, two conductive annular members 39a-1 and 39a-2 that are fixed to a housing portion 38a made of an conductive material and are arranged concentrically with the central axis C as the center. Conductive annular members 37 and 39 are arranged in a state of surface contact, respectively, in the annular regions. When the rotary pole 25 rotates, the conductive annular member 37a-1 (conductive annular member 37a-2) and the conductive annular member 39a-1 (conductive annular member 39a-2) are in a sliding relation in the rotary joint portion 36a-1 (rotary joint portion 36a-2). The housing portion 38a is connected with the rotary cylinder 32a that is a component of the electric power-introducing mechanism 30-2, by the conductive member 33a.

Similarly, rotary joint portions 36b-1 and 36b-2 comprise, for example, two conductive annular members 37b-1 and 37b-2 that are fixed to the rotary pole 25 and are arranged concentrically with the central axis C as the center, and, for example, two conductive annular members 39b-1 and 39b-2 that are fixed to a housing portion 38a made of an conductive material and are arranged concentrically with the central axis C as the center. Conductive annular members 37 and 39 are arranged in a state of surface contact, respectively, in the annular regions. When the rotary pole 25 rotates, the conductive annular member 37b-1 (conductive annular member 37b-2) and the conductive annular member 39b-1 (conductive annular member 39b-2) are in a sliding relation in the rotary joint portion 36b-1 (rotary joint portion 36b-2). The housing portion 38b is connected with the rotary cylinder 32b that is a component of the electric power-introducing mechanism 30-2, by the conductive member 33b.

Rotary joint portions 49a-1 and 49a-2 comprise, for example, two conductive annular members 42a-1 and 42a-2 that are fixed to the rotary cylinder 32a made of an conductive material and are arranged concentrically with the central axis A as the center, and, for example, two conductive annular members 41a-1 and 41a-2 that are fixed to a fixed pole 43 arranged with the central axis A as the center and are arranged concentrically with the central axis A as the center. Conductive annular members 41 and 42 are arranged in a state of surface contact, respectively, in the annular regions. When rotary cylinder 32a rotates, the conductive annular member 41a-1 (conductive annular member 41a-2) and the conductive annular member 42a-1 (conductive annular member 42a-2) are in a sliding relation in the rotary joint portion 49a-1 (rotary joint portion 49a-2). The fixed pole 43 is connected with the matching box 14 by the conductive member 44a. Meanwhile, the conductive member 44a is covered with an insulating member 51a.

Similarly, rotary joint portions 49b-1 and 49b-2 comprise, for example, two conductive annular members 47b-1 and 47b-2 that are fixed to the rotary cylinder 32b made of an conductive material and are arranged concentrically with the central axis A as the center, and, for example, two conductive annular members 46b-1 and 46b-2 that are fixed to a fixed pole 43 arranged with central axis A as the center and are arranged concentrically with the central axis A as the center. Conductive annular members 46 and 47 are arranged in a state of surface contact, respectively, in the annular regions. When rotary cylinder 32b rotates, the conductive annular member 46b-1 (conductive annular member 46b-2) and the conductive annular member 47b-1 (conductive annular member 47b-2) are in a sliding relation in the rotary joint portion 49b-1 (rotary joint portion 49b-2). The fixed pole 43 is connected with the matching box 14 by the conductive member 44b. Meanwhile, the conductive member 44b is covered with an insulating member 51b.

The electric power-introducing mechanism 30-1 has a structure electrically divided into two zones by an insulating member 45, for a configuration of applying a bias voltage (RF bias electric power) to the substrate-supporting/placing table 19 and a DC bias electric power to the electrostatic chuck 24, and two zones are serially arranged above and below with the rotation axis C as the center. That is, in the electric power-introducing mechanism 30-1, to one region divided by the insulating member 45, one of two electrodes of the electrostatic chuck 24 is electrically connected, and to the other of the divided regions, another electrode of two electrodes is electrically connected. In the embodiment, the electric power-introducing mechanism 30-1 is divided into a divided region 30-1a near the electrostatic chuck 24 and into a divided region 30-1b distant from the electrostatic chuck 24 by the insulating member 45, and the divided regions 30-1a and the 30-1b are in an insulated state each other. In the embodiment, the electrode 28a of the electrostatic chuck 24 and the divided region 30-1a are formed in the rotary pole 25 made of a conductive material, and are electrically connected via the electric power-introducing pole 29a covered with the insulating member 31a. And, the electrode 28b of the electrostatic chuck 24 and the divided region 30-1b are formed in the rotary pole 25, and are electrically connected via the electric power-introducing pole 29b covered with the insulating member 31b. Meanwhile, the electric power-introducing pole 29b is covered with the insulating member 31b in the divided region 30-1a.

As described above, the electric power-introducing mechanism 30-1 comprises a part of the region of the rotary pole 25, the housing portion 38 arranged around the rotary pole 25, the insulating member 45 dividing the electric power-introducing mechanism 30-1 into sides near the electrostatic chuck 24 and distant from it (divided region 30-1a and divided region 30-1b), and the rotary joint portion 36 made of a conductive material, for sliding the rotary pole 25 and the housing portion 38. And, in such state in which the electric power-introducing pole covered with an insulating member is insulated from the electrode of the electrostatic chuck 24 to the corresponding region of the electric power-introducing mechanism 30-1 (divided region), the above electrode and the corresponding region are electrically connected. And, the corresponding region is electrically connected with the housing portion 38 having an electroconductivity via the rotary joint portion 36 having an electroconductivity. Consequently, the housing portion 38 is connected electrically with the electric power-introducing mechanism 30-2.

As described above, in the embodiment, the electric pathway for introducing an intended electric power to the substrate-supporting/placing table and the electrostatic chuck can be included within the rotary pole 25 for rotating the substrate-supporting/placing table 19. Accordingly, the pathway for supplying electric power to the substrate-supporting/placing table and the electrostatic chuck can be secured without arranging electric wiring etc around the substrate-supporting/placing table 19 and the electrostatic chuck 24. Moreover, since the electric pathway can be included within the pole for supporting the substrate-supporting/placing table and the electrostatic chuck, it is possible to prevent the twisting of the electric circuit even when the substrate-supporting/placing table 19 is rotated.

Moreover, in the embodiment, the electric power-introducing mechanism 30-1 is divided into two divided regions 30-1a and 30-1b insulated from each other by the insulating member 45, the electrode 28a is electrically connected with the divided region 30-1a in a state of being insulated from the electrode 28a to the divided region 30-1a, and the electrode 28b is electrically connected with the divided region 30-1b in a state of being insulated from the electrode 28b to the divided region 30-1b. Accordingly, electric power can favorably be supplied from electric sources 15-1 and 15-2 to the electrostatic chuck 24 without the short circuit of positive and negative voltages supplied to the electrostatic chuck 24 on the way.

The electric power-introducing mechanism 30-2 has a structure electrically divided into two zones by an insulating member 48, for a second configuration of applying a bias voltage (RF bias electric power) to the substrate-supporting/placing table 19 and a DC bias electric power to the electrostatic chuck 24, and two zones are serially arranged right and left with the rotation axis C as the center. That is, in the electric power-introducing mechanism 30-2, one of regions divided by the insulating member 48 is electrically connected with the divided region 30-1b of the electric power-introducing mechanism 30-1, and the other of divided regions is electrically connected with the divided region 30-1a. In the embodiment, the electric power-introducing mechanism 30-2 is divided into a divided region 30-2a near the electric power-introducing mechanism 30-1 and a divided region 30-2b distant from the electric power-introducing mechanism 30-1 by the insulating member 48, and the divided regions 30-2a and the 30-2b are in an insulated state each other. In the embodiment, the matching box 14 and the divided region 30-2a are electrically connected via a conductive member 44b which is formed in the fixed pole 43 made of a conductive material and is covered with an insulating member 51b. Moreover, the matching box 14 and the divided region 30-2b are electrically connected via a conductive member 44a which is formed in the fixed pole 43 and is covered with the insulating member 51a. Meanwhile, the conductive member 44b is covered with the insulating member 51b in the divided region 30-2b.

As described above, the electric power-introducing mechanism 30-2 comprises at least a part of the region of the fixed pole 43, rotary cylinders 32a and 32b arranged around the fixed pole 43, the insulating member 48 dividing the electric power-introducing mechanism 30-2 into sides near and distant from the electric power-introducing mechanism 30-1 (divided region 30-2a and divided region 30-2b), and a rotary joint portion 49 made of a conductive material for sliding the fixed pole 43 and the rotary cylinders 32a and 32b. And, in a state in which the conductive member covered with an insulating member is insulated from the matching box 14 to the corresponding region of the electric power-introducing mechanism 30-2 (divided region), the matching box 14 and the corresponding region are electrically connected. The corresponding region is electrically connected with conductive rotary cylinders 32a and 32b via the conductive rotary joint portion 49. Consequently, rotary cylinders 32a and 32b are electrically connected with the electric power-introducing mechanism 30-1.

As described above, in the embodiment, the electric pathway for introducing electric power into the electric power-introducing mechanism 30-1 (that is, substrate-supporting/placing table, and electrostatic chuck) can be included within the fixed pole 43 for rotating the stage 18. Accordingly, the pathway for supplying electric power to the electric power-introducing mechanism 30-1 can be secured without arranging electric wiring etc around the stage 18. Moreover, since the electric pathway to the electric power-introducing mechanism 30-1 can be included within the pole for rotating the stage 18, it is possible to prevent the twisting of the electric circuit even when the stage 18 is rotated.

Moreover, in the embodiment, the electric power-introducing mechanism 30-2 is divided into two divided regions 30-2a and 30-2b insulated from each other by the insulating member 48, the matching box 14 is electrically connected with the divided region 30-2a in a state of being insulated from the matching box 14 to the divided region 30-2a, and matching box 14 is electrically connected with the divided region 30-2b in a state of being insulated from the matching box 14 to the divided region 30-2b. Accordingly, electric power can favorably be supplied from electric sources 15-1 and 15-2 to the electrostatic chuck 24 without the short circuit of positive and negative voltages supplied to the electrostatic chuck 24 on the way.

Meanwhile, in the embodiment, the fixed pole 43 and the rotary cylinder 32 are used as the mechanism for rotating the stage 18, but the mechanism is not limited to these, and a pole may be rotated. That is, the electric power-introducing mechanism 30-2 may be of any configuration when it comprises a pole (for example, fixed pole 43) and a conductive housing portion surrounding the pole (for example, rotary cylinders 32a and 32b), and a rotary joint portion for sliding the pole and the housing portion and it may rotate at least one of the pole and the housing portion about the rotation axis A while securing electric connection with the pole and the housing portion via the rotary joint portion.

As the result of the above, the introduction of two different DC bias electric power and RF bias electric power becomes possible into the substrate-supporting/placing table 19, while rotating the stage 18 about the rotation axis A, and rotating the substrate-supporting/placing table 19 about the rotation axis C.

Figure 5G:
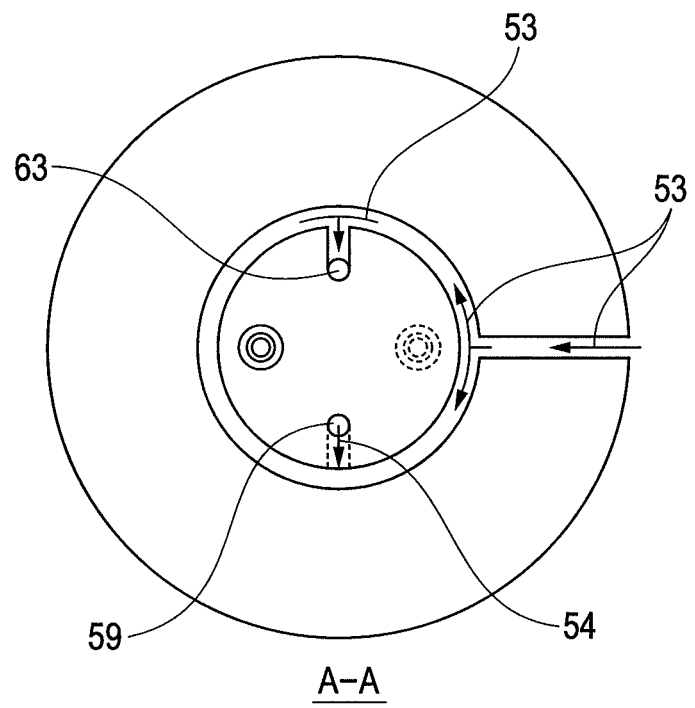
FIG. 5G is an A-A cross-sectional view in FIG. 5F.
Figure 5H:
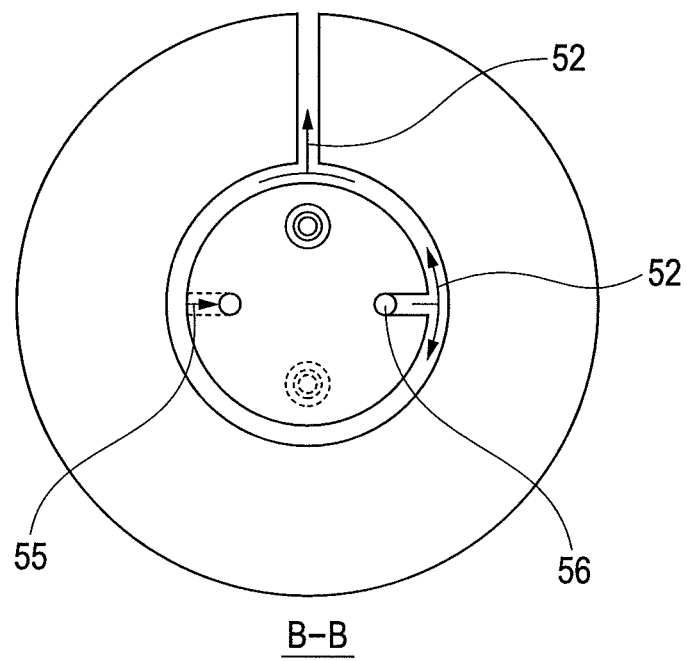
FIG. 5H is a B-B cross-sectional view in FIG. 5F.

FIG. 5G is the A-A cross-sectional view in FIG. 5F, and FIG. 5H is the B-B cross-sectional view in FIG. 5F.

A cooling medium supplied from a cooling-supplying mechanism (not shown) is introduced from a cooling medium feed port 56 in FIG. 5H, and flows in a flow path along the arrow shown in FIGS. 5F and H, which flows in a piping flow path connected with a feed port 58 by a piping member 57 shown in FIG. 5F. Furthermore, it flows in the flow path along an array 53 shown in FIGS. 5F and 5G, and is introduced into the substrate-supporting/placing table 19 from a reference numeral 63 in FIG. 5G via a through-hole (not shown) in the rotary pole 25. The cooling medium returning from the substrate-supporting/placing table 19 is guided to reference numeral 59 in FIG. 5G, flows in the flow path along an array 54 in FIGS. 5F and G, and flows in the piping flow path connected with a feed port 61 by a piping member 60. Furthermore, it flows in the flow path along an array 55 shown in FIGS. 5F and 5H, and returns to the cooling-supplying mechanism (not shown).

The cooling medium also has such effect as drawing heat generating in respective rotary joint portions by flowing simultaneously through the space formed in rotary joint portions 49 and 36, and further, can improve the lubricating properties between conductive annular members.

Meanwhile, in FIGS. 5E and 5F, the configuration, which comprises the electrostatic chuck 24 and is capable of applying the RF bias voltage to the stage 18, has been described. That is, by applying the DC voltage overlapped with the RF bias voltage to electrodes 28a and 28b of the electrostatic chuck 24, the electrostatic adsorption function and the RF bias voltage-applying function are realized. In the present invention, in the case where only one of the electrostatic adsorption function and the RF bias voltage-applying function is to be realized, it can be realized by the configuration similar to that in FIGS. 5E and 5F. Meanwhile, when the RF bias voltage-applying function is to be realized, the electrode disposed for the substrate-supporting/placing table 19 may be one.

Figure 5I:
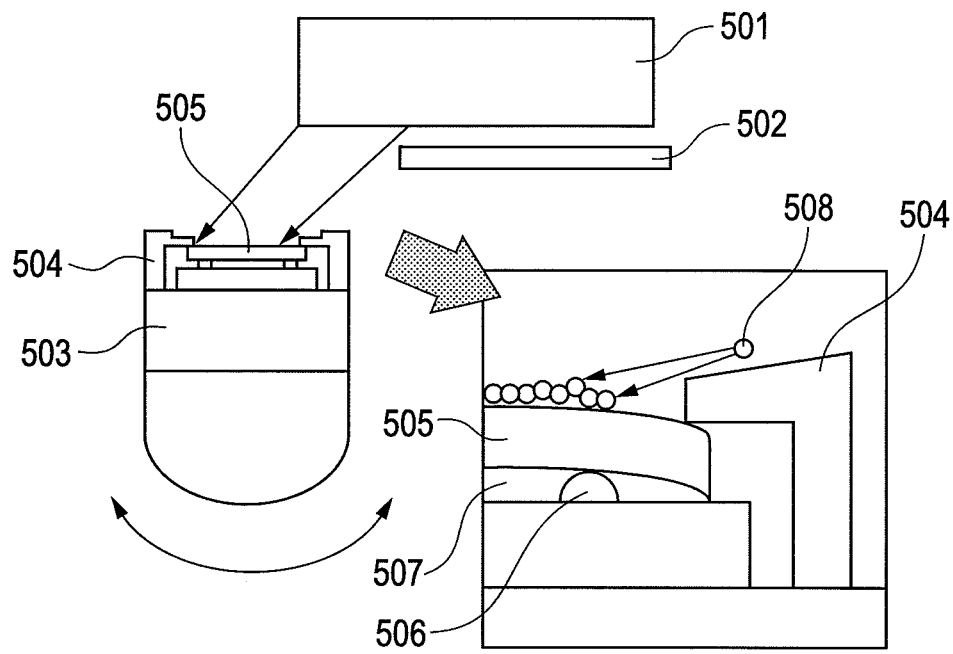
FIG. 5I is a schematic view of a stage not comprising an electrostatic adsorption mechanism and a bias power source according to the present invention.

FIG. 5I is a schematic view of a stage not comprising the electrostatic adsorption mechanism and the bias power source according to the present invention, and shows a configuration in which a shielding plate 502 is arranged between a target 501 and a stage 503. Meanwhile, details of a sputtering apparatus having a stage not comprising the electrostatic adsorption mechanism and the bias power source will be described in FIG. 9 to be described later. In FIG. 5I, on the substrate-supporting surface of a stage 503, an O-ring 506 is disposed, and, to the region surrounded by the O-ring 506, cooling gas 507 is supplied. Furthermore, outside the substrate-supporting surface, a mask 504 is arranged. By such configuration, the substrate 505 is arranged on the O-ring 506, and the substrate 505 is fixed on the stage 503 by holding the edge portion of the substrate 505 down by the mask 504.

Consequently, as shown in FIG. 5I, sputtered particles 508 from the target 501 enters obliquely, and thus, a region in which no deposition occurs by being shielded by the mask 504 (for example, the region of the substrate 505 supported by the mask 504, etc.) is formed. Moreover, the place where the mask 504 chucks the substrate 505 is positioned outside the O-ring 506 for sealing the cooling gas 507, and thus, the substrate 505 bends with the O-ring 506 as a supporting point.

Figure 5J:
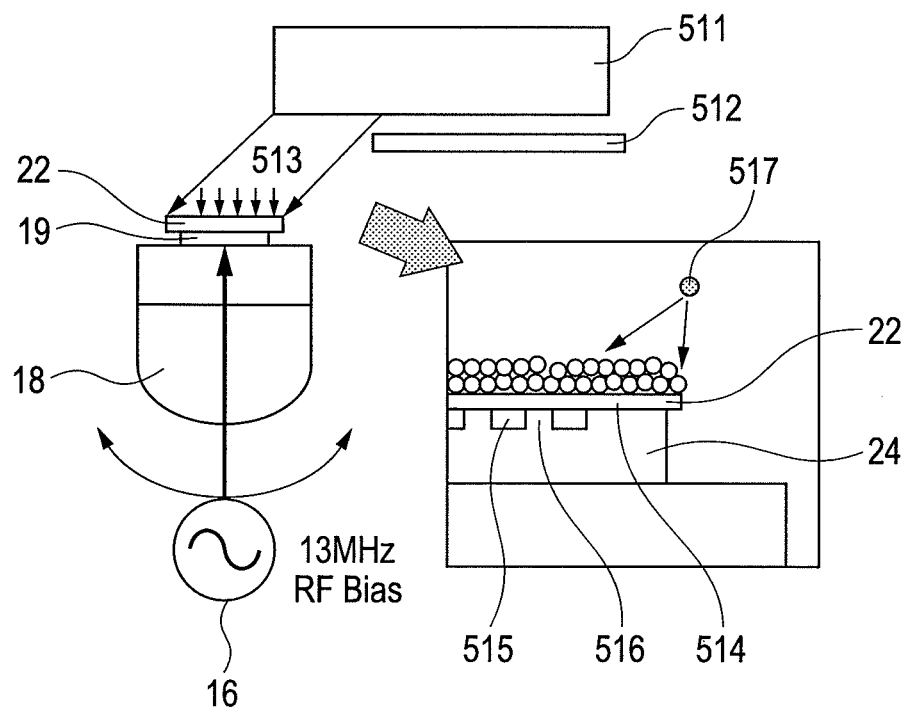
FIG. 5J is a schematic configuration diagram of a stage 18 of a first and second sputtering apparatuses according to the present invention, comprising the electrostatic adsorption mechanism and the bias power source.

FIG. 5J is a schematic configuration diagram of the stage 18 of the first and second sputtering apparatuses according to the present invention, which comprises the electrostatic adsorption mechanism and the bias power source, and shows the configuration in which a shielding plate 512 is arranged between the target 511 and the stage 18. In the present invention, as shown in FIG. 5J, the substrate-supporting/placing table 19 has the electrostatic chuck 24 as the electrostatic adsorption mechanism. The electrostatic chuck 24 has a periphery sealing portion 514, a convex portion 515 and a concave portion 516 on the surface supporting the substrate 22, and is electrically connected with DC electric sources 15-1 and 15-2 by the configuration shown particularly in FIG. 5E and FIG. 5F. The concave portion 516 is connected with a gas-supplying mechanism (not shown) via gas-introducing pathway 37 explained in FIG. 5E. Accordingly, to the concave portion 516, the cooling gas is supplied.

As described above, in the present invention, the electrostatic chuck 24 is used, and thus, the substrate 22 can favorably be fixed to the substrate-supporting/placing table 19 even when the mask 504 is not used. Accordingly, there is no object such as the mask 504 that blocks intended sputtered particles 517, thereby making it possible to carry out the deposition on the whole surface of the substrate 22. Furthermore, the substrate-supporting surface of the electrostatic chuck 24 is formed into a convexed and concaved surface, and therefore, the cooling gas can be enclosed between the substrate 22 and the substrate-supporting/placing table 19 without using the O-ring 506. Consequently, the deposition can be carried out without generating a warp for the substrate 22.

Furthermore, when the deposition is carried out by using the stage 503 in FIG. 5I, it is possible to deposit a film of Hk>200 Oe by controlling a film growth angle to be 60° or more. However, such defect was found that, when Hk>200 Oe, the film density after the deposition becomes small and Bs becomes small sharply.

Therefore, in the embodiment, such configuration is adopted that the sputtering apparatus is connected with the RF power source 16 and the bias voltage may be applied to the stage 18. Accordingly, during the sputtering deposition, a vertical component 513 due to the bias acts on the substrate 22, and the denseness of the film after the deposition can be improved.

As described above, in the embodiment, an appropriate deposition for the whole substrate surface is made possible by using the electrostatic adsorption mechanism. Moreover, the deposition of a dense film is made possible by being connected with the RF electric source to thereby apply the bias voltage to the stage.

Furthermore, when an RF bias is applied, for example, to the configuration shown in FIG. 5I for the purpose of the densification of the film to be formed, the mask 504 may function as a new target to cause the contamination in the deposition. However, in the embodiment, the substrate can favorably be fixed without using a mask to be a contamination factor by carrying out the electrostatic adsorption mechanism and the bias application at the same time. Therefore, the dense film can be formed on the whole substrate surface, while suppressing the contribution to sputtered particles other than those from an intended target.

Figure 6A:
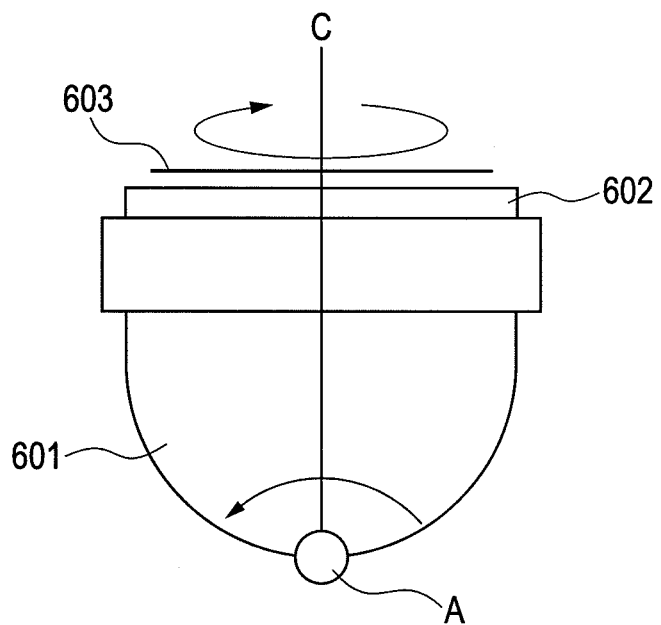
FIG. 6A is a side view of a stage for placing a substrate according to the present invention.
Figure 6B:
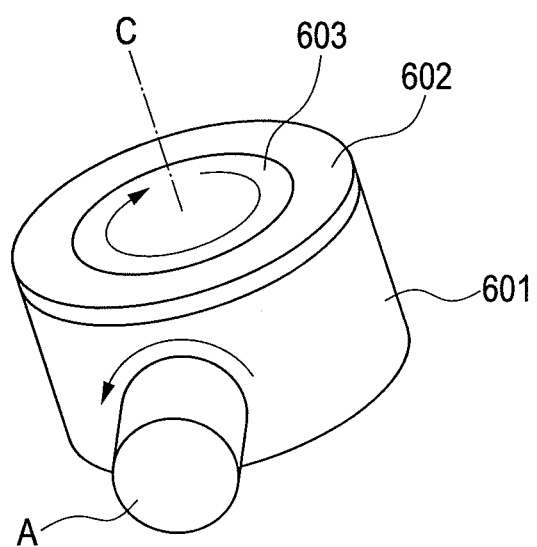
FIG. 6B is a perspective view of a stage for placing a substrate according to the present invention.

FIG. 6A is a side view of a stage 601 utilizable as the stage of sputtering apparatuses in FIGS. 4A and 5A. The stage 601 has a substrate placement table 602, and, on the substrate placement table 602, a substrate 603 is placed. FIG. 6B is a perspective view of the stage 601 according to the present invention. The stage 601 is configured so as to be rotatable about the rotation axis A as the center, in the same manner as FIGS. 4 and 5. The substrate placement table 602 of the stage 601 is configured so as to be rotatable about the rotation axis C that is perpendicular to the rotation axis A and passes the center of the substrate 603, and the substrate 603 can be rotated about the rotation axis C. The substrate placement table 602 can be rotated using a rotation means such as a motor, and the rotation means can be controlled by a controlling apparatus.

Figure 7:
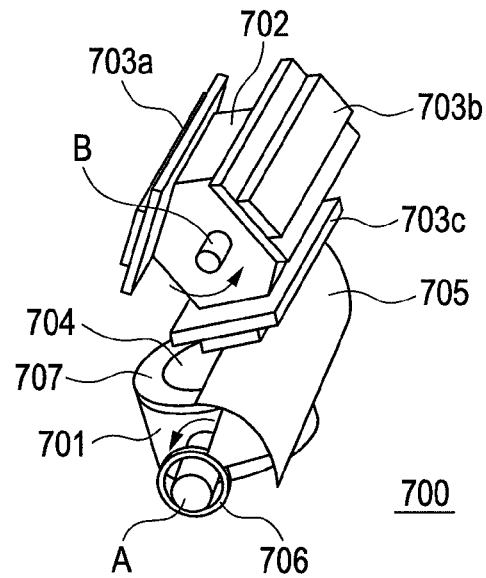
FIG. 7 is a drawing showing an example of a sputtering apparatus according to an embodiment of the present invention.

FIG. 7 is a drawing showing an example of a sputtering apparatus according to another embodiment of the present invention. A sputtering apparatus 700 comprises a stage 701 for placing a substrate 704, a cathode 702 for supporting a target 703, and a shielding plate 705. The stage 701 and the cathode 702 respectively comprise the rotation axis A and the rotation axis B, and the stage 701 and the cathode 702 are configured so as to rotate about the rotation axis A and the rotation axis B, at an arbitrary angle from a certain reference plane (not shown). For example, the stage 701 and the cathode 702 can be rotated by such rotation means as a motor, and the rotation means can be controlled by a controlling apparatus.

The rotation axis A and the rotation axis B are arranged to be parallel to each other, and the target 703 is supported by the cathode 702 so as to become parallel to the rotation axis B. The target 703 supported by the cathode 702 rotatable about the rotation axis B at an arbitrary angle can cause sputtered particles to deposit on the substrate 704 by bombarding ions in a plasma to the surface of the target 703 in each case of a stationary state and rotating state. The substrate 704 subjected to the deposition treatment by the target 703 is placed on the stage 701 rotatable about the rotation axis A at an arbitrary angle.

Furthermore, a shielding plate 705 is disposed between the target 703 and the stage 701, and the shielding plate 705 has a means to rotate about the rotation axis A at an arbitrary angle from a certain reference plane (not shown) to thereby carry out a function of finely adjusting the thickness distribution of a film to be deposited and enhancing the selectivity of the incident angle of sputtered particles. The shielding plate 705 rotates about the rotation axis A independently from the cathode 702 or the stage 701, by controlling appropriately a rotation means 706 for the shielding plate by a controlling apparatus.

A film having an enhanced orientation usually includes plural layers, and representative examples thereof are Ta/FeCo, NiFe/FeCo, and NiFeCr/FeCo. In order to produce such film that includes plural layers, the target 703 supported by the cathode 702 is, desirably, in plural number. In the example, there are plural targets 703a, 703b and 703c, and targets 703a, 703b and 703c can properly be used appropriately in accordance with the use application. The rotation axis A and the rotation axis B are arranged parallel to each other, and targets 703a, 703b and 703c are supported by the cathode 702 so as to become parallel to the rotation axis B. Targets 703a, 703b and 703c rotatable about the rotation axis B deposit sputtered particles on the substrate 704 by bombarding ions in a plasma to the surface of the target 703.

Figure 8:
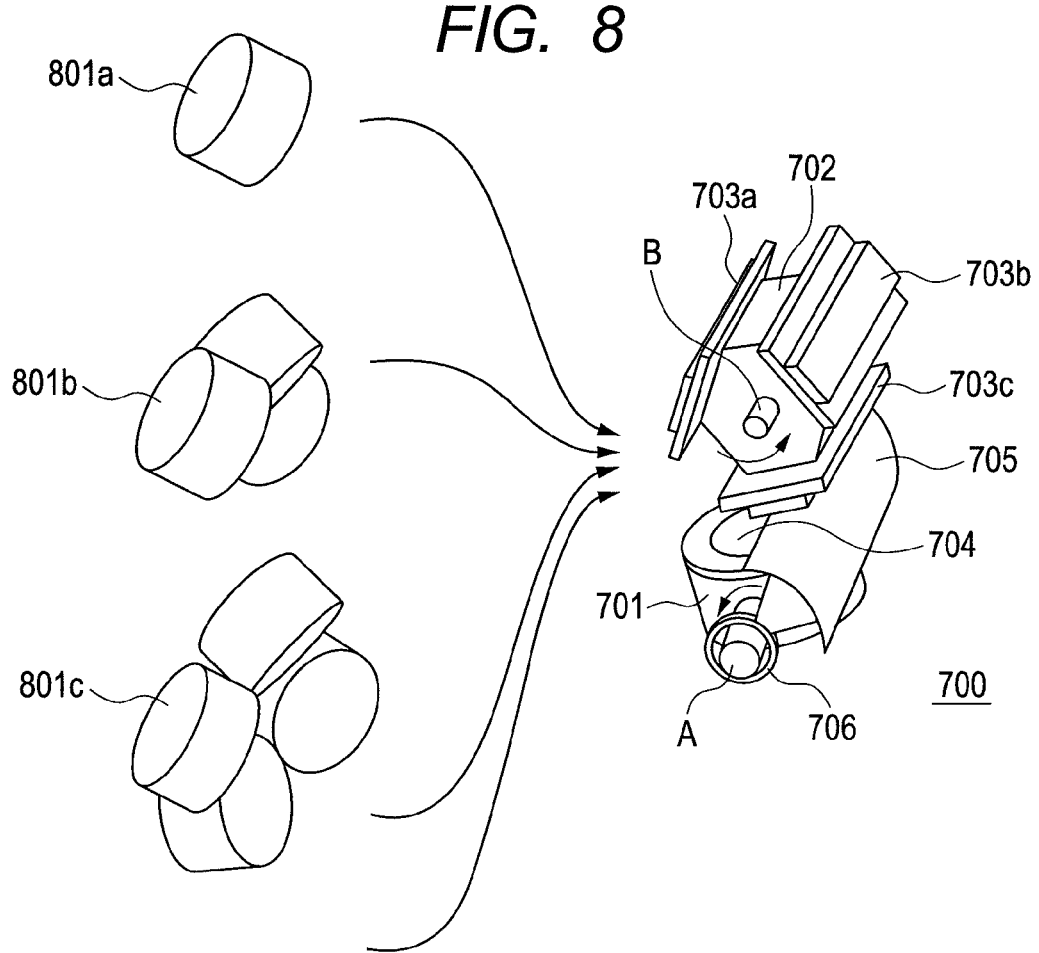
FIG. 8 is a drawing showing the combination of a sputtering apparatus according to an embodiment of the present invention and a multiple sputtering system.

FIG. 8 shows a sputtering apparatus 700 according to an embodiment of the present invention, and combinations with a various types of multiple sputtering systems 801, specifically a 1-cathode unit 801a, 3-cathode unit 801b, or a 4-cathode unit 801c. In the configuration in FIG. 8, by using the combination of the sputtering apparatus 700 and the multiple sputtering systems 801, specifically a 1-cathode unit 801a, 3-cathode unit 801b, or a 4-cathode unit 801c, the use applications can further be expanded.

Figure 9:
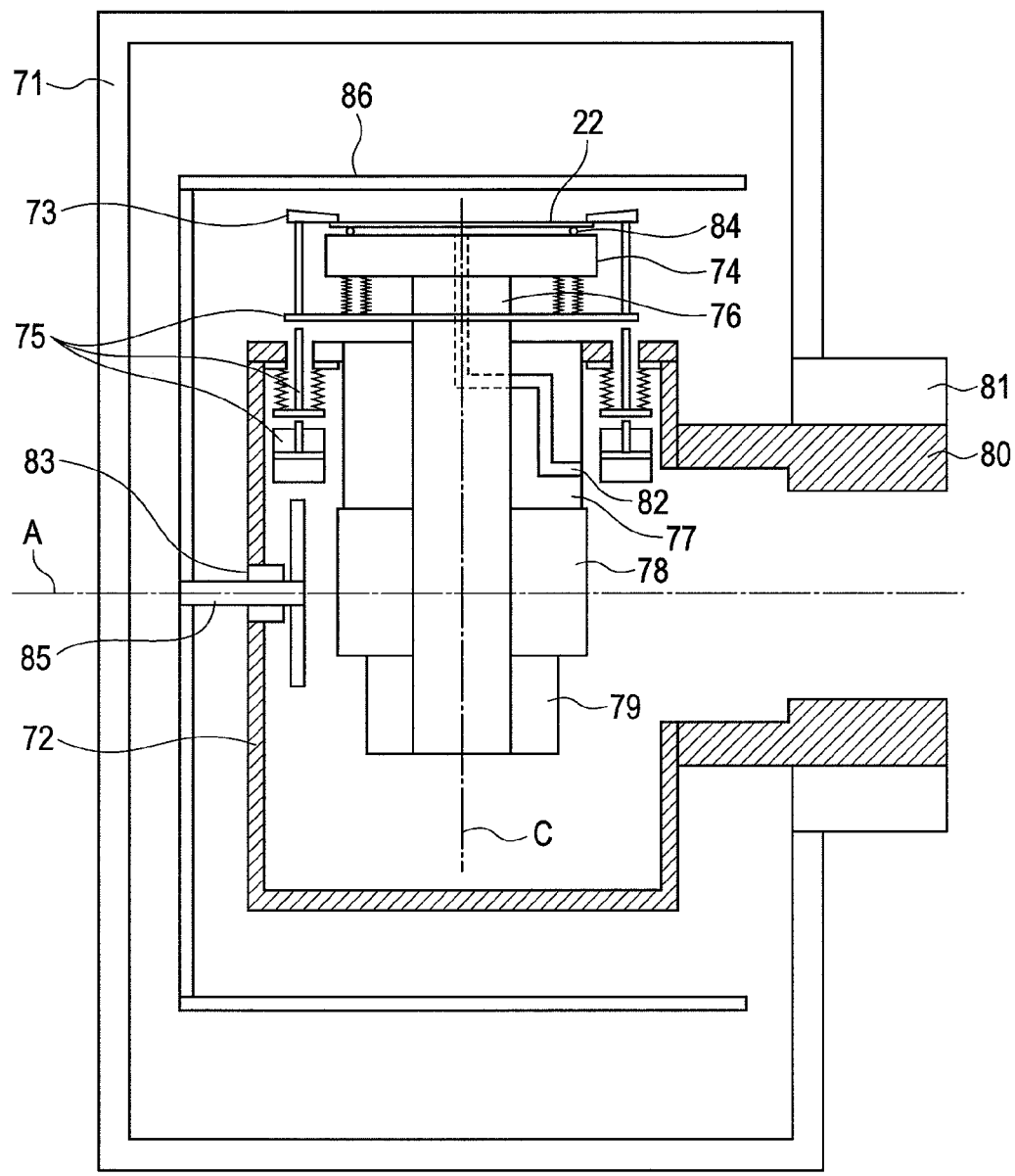
FIG. 9 is an internal cross-sectional view of a sputtering apparatus mounted with a stage not comprising an electrostatic adsorption mechanism and a bias power source (a drawing corresponding to the cross-sectional view in FIG. 5E).

FIG. 9 is an inside cross-sectional view of a sputtering apparatus mounted with a conventional stage not comprising the electrostatic adsorption mechanism and the bias power source (drawing corresponding to cross-sectional view in FIG. 5E). For comparison with the sputtering apparatus of the present invention, in the drawing, the structure around the stage of a conventional sputtering apparatus will be explained.

A stage 72 is arranged in a vacuum chamber 71, and a substrate-supporting/placing table 74 is arranged in the upper portion of the stage 72. To the bottom surface of the substrate-supporting/placing table 74, a rotary pole 76 rotatable about the central axis C is joined. The substrate 22 is chucked by being pressed to the substrate-supporting/placing table 74 by a mask 73 connected with a drive mechanism 75 capable of carrying out an up-and-down operation by using a compressed air as a driving source. The rotary pole 76 is fitted rotatably to a hole portion formed in the upper portion of the stage 72 via a vacuum seal mechanism 77 such as a magnetic fluid seal. This maintains the airtightness inside the vacuum chamber 71. To the lower portion of the vacuum seal 77, a rotary driving mechanism 78 and a cooling water-feeding mechanism 79 are serially connected on the same axis about the rotation axis C. The rotary driving mechanism 78 is equivalent to the rotary driving mechanism 27 shown in FIG. 5E, and the explanation thereof is omitted. Inside the cooling water-introducing mechanism, the rotary joint portion having the same construction as that of the rotary joint 36 or 49 shown in FIG. 5E is built-in to make the introduction of cooling water into the rotary pole 76 possible. The cooling water is introduced into the substrate-supporting/placing table 74 via a through-hole (not shown) provided in a vertical direction inside the rotary pole.

The substrate-supporting/placing table 74 also has a structure that makes it possible to introduce a cooling gas to the rear side of the substrate. In the structure, the gas is introduced from the vacuum seal mechanism 77 traveling a flow path 82 and reaches the rear side of the substrate. Meanwhile, in order to cause the cooling gas having reached the rear surface of the substrate to stay in the rear surface of the substrate, an O-ring 84 is arranged on the rear side of the substrate.

Reference numeral 80 denotes a rotary cylinder rotatable about the rotation axis A, and the stage 72 is connected with the rotary cylinder 80. The rotary cylinder 80 is fitted rotatably to a hole portion formed in the side surface of the vacuum chamber 71, for example, via a vacuum seal mechanism 81 such as a magnetic fluid seal. This maintains the airtightness inside the vacuum chamber 71. The rotary cylinder 80 is rotated, for example, by a servomotor.

Reference numeral 85 is a rotary pole rotatable about the rotation axis A. The rotary pole 85 is fitted rotatably to a hole portion formed in the side surface of the stage 72, for example, via a vacuum seal mechanism 83 such as a magnetic fluid seal. This maintains the airtightness inside the vacuum chamber 71. The rotary pole 85 is connected with a shielding plate 86, which is rotated, for example, by a servomotor.

EXAMPLE

Next, a film-forming method, which uses a sputtering apparatus mounted with the stage of the present invention comprising the electrostatic adsorption mechanism and the bias power source, will be explained.

In the vacuum chamber 11 of the sputtering apparatus illustrated in FIG. 5C, an substrate is arranged, and the inside of the vacuum 11 is evacuated down to $10^{-6}$ Pa by a turbo-molecular pump. After the inside of the vacuum chamber has reached $10^{-6}$ Pa, the substrate 22 is statistically adsorbed on the stage 18 by the electrostatic adsorption mechanism (electrostatic chuck 24) shown in FIG. 5J.

Here, when a uniaxially anisotropic film is to be formed, so as to cause sputtered particles to enter obliquely to the substrate, the stage 18 is rotated relative to the target until an intended angle relative to the rotation axis A. At the same time as the start of the sputtering process, the stage 18 is rotated at 0.17 rpm on an average. With a help from the shielding plate 21 placed between the target and the stage 18, sputtered particles of an intended angle enter the substrate 22, which makes the formation of a uniaxially anisotropic film possible. Furthermore, it was confirmed that the film density increased 1.45 times by overlapping an RF electric power in 200 W using the bias electric power application mechanism mounted on the stage 18.

On the other hand, by making the incident angle relative to the substrate 22 comparatively small (25° to 40°), the expression of anisotropy derived from a substrate stress can be expected, in addition to the expression of anisotropy derived from the oblique growth of the magnetic film. In this case, it becomes possible to adjust the film stress by overlapping an RF electric power (RF bias) on the substrate 22 held by the electrostatic chuck 24 as the electrostatic adsorption mechanism using a bias electric power application mechanism mounted on the stage 18 to thereby adjusting the magnitude of the anisotropic magnetic field. An RF electric power of 100 W raised the anisotropic magnetic field about 1.33 times.

There is such case that a nonmagnetic layer having a thickness of around 1 nm is formed between magnetic layers as an intermediate layer in order to lower the coercive force of an anisotropic film. In such case, while rotating the substrate-supporting/placing table 19 about the rotation axis C at 100 rpm in the horizontal direction, at the same time, the stage 18 is rotated about the rotation axis A at 0.1 rpm. While maintaining the rotation, sputtering deposition is carried out on the substrate 22. According to the film-forming method of the present invention, the deposition is carried out while rotating the substrate-supporting/placing table 19 about the rotation axis C at 100 rpm, and, at the same time, rotating the stage 18 relative to the rotation axis A at 0.1 rpm. Therefore, it becomes possible to deposit an ultrathin film in which the difference between the inner and outer circumferences of the substrate is favorably suppressed.

In the film-forming method of the present invention, the substrate is electrostatically adsorbed to the substrate stage by the electrostatic adsorption mechanism and, at the same time, the bias voltage is applied to the substrate by the bias voltage-applying mechanism. Therefore, the deposition on the whole surface becomes possible while improving the denseness and adjusting the stress of the sputtered film.

Above-described examples do not limit the range of the present invention, but, on the basis of the teaching or the suggestion of examples, above-described examples can appropriately be changed in order to realize the subject content of the claim of the present invention.

The invention claimed is:

1. A sputtering apparatus comprising:
  a cathode having a sputtering target-supporting surface, the sputtering target-supporting surface being rotatable about a first rotation axis;
  a stage having a substrate-supporting surface, the substrate-supporting surface being rotatable about a second rotation axis arranged parallel to the first rotation axis and the substrate-supporting surface;
  at least one electrode disposed inside the stage;
  at least one cylinder fixed to the stage, the at least one cylinder being rotatable about the second rotation axis;
  at least one conductive member that is arranged inside the cylinder, the at least one conductive member being electrically connected with an electric source and the cylinder;
  a pole disposed rotatable about a third rotation axis that is perpendicular to the second rotation axis;
  at least one electric power-introducing pole that is disposed inside the pole and is supplied with a voltage to be applied to the electrode; and
  an electric power-introducing mechanism arranged around the pole, the electric power-introducing mechanism being electrically connected with the pole and in a sliding relation with the pole,
  wherein the electric power-introducing mechanism and the cylinder are electrically connected with each other, and
  wherein the electrode and the cylinder are electrically connected with each other so that a voltage from the electric source is introduced into the electrode via the cylinder.

2. The sputtering apparatus according to claim 1, wherein:
  the electric source is a DC electric source, and
  when supporting a substrate on the substrate-supporting surface, a DC voltage is applied to the electrode to thereby cause the substrate to be adsorbed electrostatically to the substrate-supporting surface.

3. The sputtering apparatus according to claim 1, wherein:
  the conductive member is electrically connected with a bias power source capable of applying a bias voltage to the stage, and
  the bias voltage is applied to the electrode during sputtering deposition.

4. The sputtering apparatus according to claim 1, wherein:
  the electric source is a DC electric source,
  the conductive member is electrically connected with a bias power source capable of applying a bias voltage to the stage, and
  when supporting a substrate on the substrate-supporting surface, a DC voltage is applied to the electrode to thereby cause the substrate to be adsorbed electrostatically to the substrate-supporting surface, and the DC voltage overlapped with the bias voltage is applied to the electrode.

5. The sputtering apparatus according to claim 1, wherein the stage is rotatable about the third rotation axis perpendicular to the second rotation axis and has a substrate-supporting/placing table having the substrate-supporting surface.

6. The sputtering apparatus according to claim 5, wherein the pole is connected with a surface of the substrate-supporting/placing table facing the substrate-supporting surface, the apparatus further comprising:
  a conductive housing that is arranged around the pole and is supplied with a voltage to be applied to the electrode; and
  an electric power-introducing portion disposed inside the substrate-supporting/placing table and the pole,
  wherein the substrate-supporting surface is rotatable about the third rotation axis by the rotation of the pole, and
  wherein the electrode and the housing are electrically connected via the electric power-introducing portion.

7. The sputtering apparatus according to claim 5, further comprising a controlling apparatus for controlling the rotation of the substrate-supporting/placing table.

8. The sputtering apparatus according to claim 1, further comprising a shielding plate that is arranged between the sputtering target-supporting surface and the substrate-supporting surface and is rotatable about the first rotation axis or the second rotation axis.

9. The sputtering apparatus according to claim 8, further comprising a controlling apparatus for controlling the rotation of at least one of the sputtering target-supporting surface and the substrate-supporting surface,
  wherein the controlling apparatus controls the rotation of the shielding plate so as to block a sputtered particle entering at an angle smaller than a prescribed angle, the angle being formed relative to the normal line of the substrate-supporting surface.

10. The sputtering apparatus according to claim 1, further comprising a controlling apparatus for controlling the rotation of at least one of the sputtering target-supporting surface and the substrate-supporting surface.

11. The sputtering apparatus according to claim 1, wherein the substrate-supporting surface has a substrate-adsorbing surface in which a convex and a concave are formed.

12. The sputtering apparatus according to claim 11, wherein the concave portion of the convex and the concave is connected with a cooling medium-supplying means for cooling a substrate.

13. The sputtering apparatus according to claim 1, wherein the conductive member is disposed inside a pole that is arranged parallel to the substrate-supporting surface inside an opening of the cylinder.

* * * * *